United States Patent
Thachile

(10) Patent No.: US 9,614,527 B2
(45) Date of Patent: Apr. 4, 2017

(54) DIFFERENTIAL TO SINGLE-ENDED SIGNAL CONVERSION

(71) Applicant: FUJITSU LIMITED, Kawasaki-shi, Kanagawa (JP)

(72) Inventor: Pradip Thachile, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 61 days.

(21) Appl. No.: 14/477,723

(22) Filed: Sep. 4, 2014

(65) Prior Publication Data

US 2016/0072459 A1 Mar. 10, 2016

(51) Int. Cl.
*H03F 3/45* (2006.01)
*H03K 19/0185* (2006.01)
*H04L 25/00* (2006.01)
*H04L 25/02* (2006.01)

(52) U.S. Cl.
CPC ..... *H03K 19/018507* (2013.01); *H04L 25/00* (2013.01); *H04L 25/0272* (2013.01); *H04L 25/0292* (2013.01)

(58) Field of Classification Search
CPC .................................................. H03F 1/3217
USPC ................. 330/129, 301, 259, 140
See application file for complete search history.

(56) References Cited

U.S. PATENT DOCUMENTS

| 5,406,221 A | * | 4/1995 | Samani | ............... H03G 1/0023 330/254 |
| 7,671,677 B2 | * | 3/2010 | Kindt | ....................... H03F 1/34 330/258 |

* cited by examiner

*Primary Examiner* — Khanh V Nguyen
*Assistant Examiner* — Khiem Nguyen
(74) *Attorney, Agent, or Firm* — Maschoff Brennan

(57) ABSTRACT

A circuit may include a signal converter configured to convert a differential signal to a single-ended signal. The circuit may also include a biasing circuit configured to set a bias of the signal converter based on a feedback of the single-ended signal such that a voltage level of the single-ended signal is at a target voltage level.

15 Claims, 8 Drawing Sheets

US 9,614,527 B2

DIFFERENTIAL TO SINGLE-ENDED SIGNAL CONVERSION

FIELD

The embodiments discussed herein are related to conversion of differential signals to single-ended signals.

BACKGROUND

High-speed data communication often includes the use of differential signals. Additionally, the differential signals may be converted to single-ended signals for various applications. The differential signals and the single-ended signals may have different voltage levels due to different voltage requirements of the components with which the signals may be associated. The conversion process as used by many traditional systems may cause problems such as duty cycle distortion and process variability (e.g., pressure, volume, and temperature (PVT) variability).

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a signal converter configured to convert a differential signal to a single-ended signal. The circuit may also include a biasing circuit configured to set a bias of the signal converter based on a feedback of the single-ended signal such that a voltage level of the single-ended signal is at a target voltage level The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

High-speed data communication often includes differential signals for the distribution of the data because of noise and power advantages of differential signals as compared to single-ended signals. However, in many instances a signal source may be configured to generate a differential signal that may be sent to an electrical circuit that is configured to use single-ended signals and not differential signals for their operations. As such, differential signals are often converted into single-ended signals using differential to single-ended signal conversion circuits (referred to hereinafter as "signal conversion circuits").

The voltage levels (e.g., voltage swings, max voltages, minimum voltages, etc.) associated with differential signals as compared to single-ended signals are often different. As such, the signal conversion circuits are often configured to apply a gain and/or a bias during the conversion process such that a voltage level of a single-ended signal may be at a target level that may be different from a voltage level of a differential signal that may be converted into the single-ended signal. However, many traditional signal conversion circuits and techniques may be plagued with problems such as duty cycle distortion (DCD) and process variability (e.g., pressure, volume, and temperature (PVT) variations)

As disclosed in detail below, a signal conversion circuit may include a signal converter configured to receive a differential signal and to convert the differential signal to a single-ended signal, which may be output at an output terminal of the signal conversion circuit. The signal conversion circuit may also include a biasing circuit configured to set and/or adjust a bias of the signal converter based on a feedback of the single-ended signal. The biasing may be set or adjusted such that the single-ended signal that is output by the signal converter is at a target voltage level. By setting the biasing based on the feedback, DCD and process variability may be reduced as compared to other conversion techniques.

Embodiments of the present disclosure will be explained with reference to the accompanying drawings.

Figure 1:
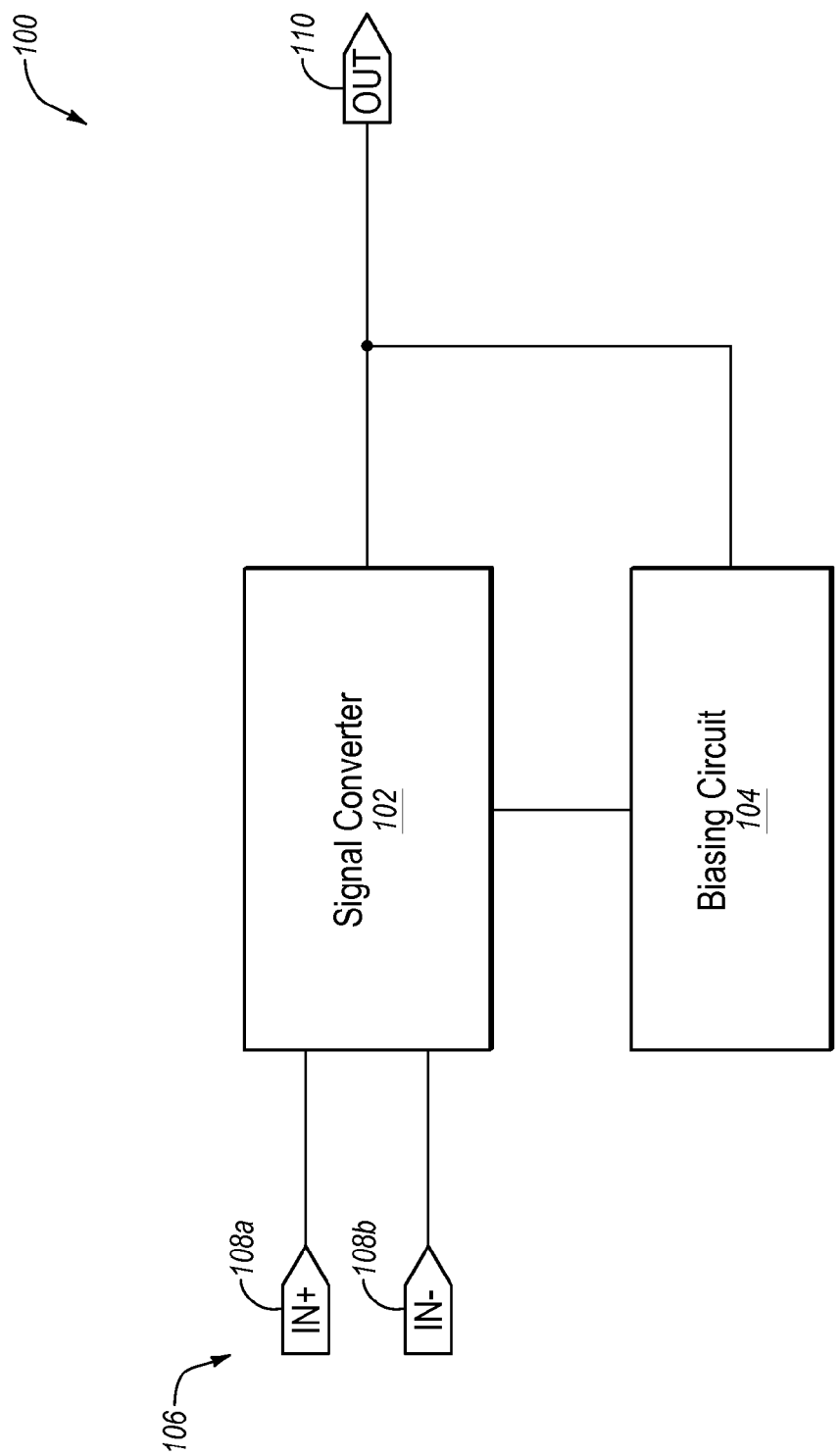
FIG. 1 illustrates an example differential to single-ended signal conversion circuit.

FIG. 1 illustrates an example differential signal to single-ended signal conversion circuit 100 ("the circuit 100"), arranged in accordance with at least one embodiment described herein. The circuit 100 may include a signal converter 102, a biasing circuit 104, an input terminal 106, and an output terminal 110.

The input terminal 106 may be configured as a differential input terminal that is configured to receive a differential signal. For example, the input terminal 106 may include a first input terminal 108*a* and a second input terminal 108*b*. The first input terminal 108*a* may be configured to receive a first signal (e.g., a positive signal) of the differential signal and the second input terminal 108*b* may be configured to receive a second signal (e.g., a negative signal) of the differential signal. The terms "positive" and "negative" as used with respect to differential signals refers to signals that are opposite each other and not necessarily that they are positive or negative.

The signal converter 102 may include any suitable system, apparatus, or device that is configured to receive a differential signal and to convert the differential signal to a single-ended signal. For example, the signal converter 102 may include a differential to single-ended amplifier that is configured to convert the differential signal to the single-ended signal and apply a gain and/or a bias such that the voltage level of the single-ended signal is different from the voltage level of the differential signal. The signal converter 102 may be configured to generate the single-ended signal such that its respective voltage level is at a target voltage level. For example, in some embodiments, the signal converter 102 may be configured to convert the differential signal into a single-ended signal with voltage levels of the differential signal and the single-ended signal that correspond to a conversion from a common mode logic (CML) system to a complementary metal oxide semiconductor (CMOS) logic family system. The single-ended signal may be output to the associated load circuit via the output terminal 110.

The biasing circuit 104 may be coupled to the output terminal 110 such that the biasing circuit 104 may receive a feedback of the single-ended signal. As detailed below, the biasing circuit 104 may be configured to set a bias of the signal converter 102 based on the feedback of the single-ended signal such that the voltage level of the single-ended signal is at the target voltage level.

Modifications, additions, or omissions may be made to the circuit 100 without departing from the scope of the present disclosure. For example, the differentiation between different circuits of the circuit 100 is merely to aid in the description and is not meant to be limiting. Additionally, the circuit 100 may include any number of components not expressly disclosed or discussed such as one or more buffers that may be coupled between the signal converter 102 and the output terminal 110.

Figure 2:
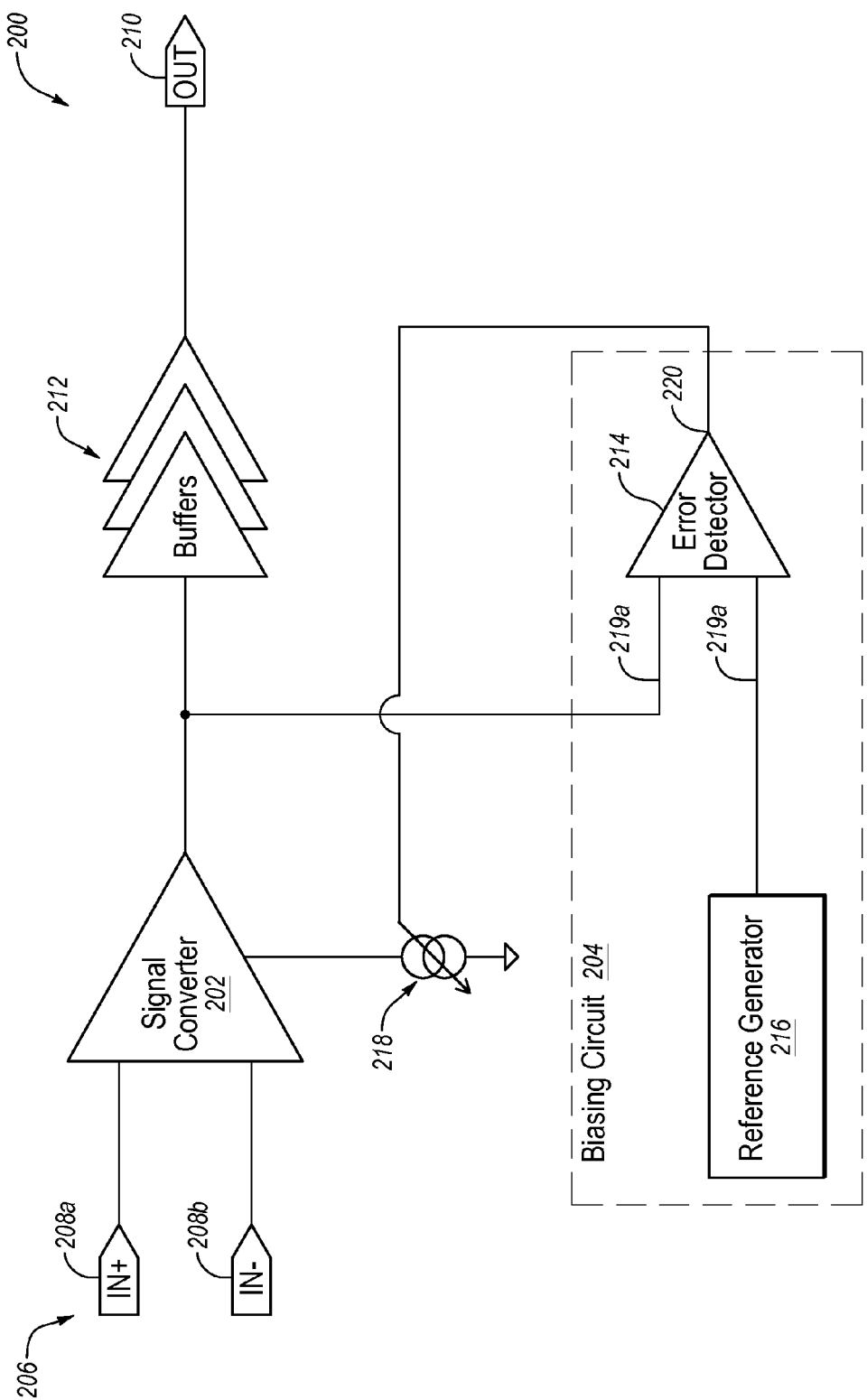
FIG. 2 illustrates another example differential to single-ended signal conversion circuit.

FIG. 2 illustrates an example differential to single-ended signal conversion circuit 200 ("the circuit 200"), arranged in accordance with at least one embodiment described herein. The circuit 200 may include a signal converter 202, a biasing circuit 204, an input terminal 206, an output terminal 210, and one or more buffers 212.

The input terminal 206 may be analogous to the input terminal 106 of FIG. 1. For example, the input terminal 206 may be configured as a differential input terminal that includes a first input terminal 208a configured to receive a first signal (e.g., a positive signal) of a differential signal. The input terminal 206 may also include a second input terminal 208b configured to receive a second signal (e.g., a negative signal) of the differential signal.

The signal converter 202 may be analogous to the signal converter 102 of FIG. 1 and may be configured to convert the differential signal received at the input terminal 206 to a single-ended signal. In some embodiments (e.g., as illustrated), the signal converter 202 may include an amplifier configured to perform the conversion. Additionally, a bias of the signal converter 202 that may affect a bias and/or a gain of the single-ended signal with respect to the differential signal may be set or adjusted based on a setting or adjustment of a current produced by an adjustable current source 218 of the signal converter 202. As such, a voltage level of the single-ended signal may be set or adjusted by setting or adjusting the current of the adjustable current source 218.

The circuit 200 may also include one or more buffers 212 coupled between the signal converter 202 and the output terminal 210. The buffers 212 may be configured to receive the single-ended signal that may be output by an output terminal of the signal converter 202. The buffers 212 may buffer the single-ended signal and may output the buffered single-ended signal such that it may be received at the output terminal 210 and may propagate to an associated load circuit. The buffers 212 may be configured based on the load circuit that may be configured to receive the single-ended signal. For example, in some embodiments, the buffers 212 may be configured to buffer the single-ended signal in a manner such that the single-ended signal may optimally drive the load circuit. The configuration of the buffers 212 may be based on any suitable technique or mechanism.

The biasing circuit 204 is an example implementation of the biasing circuit 104 of FIG. 1. In the illustrated example, the biasing circuit 204 may include an error detector 214 and a reference generator 216.

The reference generator 216 may include any suitable system, apparatus, or device that is configured to generate a reference voltage. The reference voltage may be a target average DC voltage that is associated with a target voltage level of the single-ended signal. For example, in some embodiments, the target voltage level of the single-ended signal may be associated with a CMOS system. The reference voltage may accordingly represent an average DC voltage needed for correct recognition of signals by CMOS based circuits. In some embodiments, the reference voltage may represent the optimal average DC voltage that may be needed.

The error detector 214 may include a first input terminal 219a that may be coupled between the signal converter 202 and the buffers 212. Therefore, the error detector 214 may be configured to receive a feedback of the single-ended signal that may be output by the signal converter 202. The error detector 214 may also include a second input terminal 219b that may be configured to receive the reference voltage from the reference generator 216. An output terminal 220 of the error detector 214 may be coupled to the adjustable current source 218 such that a control signal that may be output by the error detector 214 at the output terminal 220 may set or adjust the current of the adjustable current source 218.

The error detector 214 may include any suitable system, apparatus, or device configured to compare an average voltage level of the single-ended signal that may be received at the first input terminal 219a with the reference voltage that may be received at the second input terminal 219b. The error detector 214 may be configured to generate the control signal based on the comparison between the average voltage level of the single-ended signal and the reference voltage.

For example, in some embodiments (such as the illustrated example of FIG. 2), the error detector 214 may include an error amplifier that is configured to generate a control signal at the output terminal 220 when the reference voltage and the average voltage of the single-ended signal are not equal.

The adjustable current source 218 may be configured such that the control signal may drive the adjustable current source 218 in a manner that sets the bias and/or the gain of the signal converter 202 such that the voltage level of the single-ended signal may be set. For example, in some embodiments, the error detector 214 may be configured such that the voltage of the control signal is a function of the difference between the average voltage level of the single-ended signal and the reference voltage. In particular, in some embodiments, the error detector 214 may be configured such that the voltage of the control signal may be equal to a multiplication of a gain factor (e.g., a constant greater than one) applied to the difference. The setting of the current may be made such that or until the average voltage of the single-ended signal may be approximately equal to, or equal to, the reference voltage. Therefore, the bias of the signal converter 202 may be set or adjusted such that the average voltage of the single-ended signal may be at or near the target voltage of the single-ended signal.

Modifications, additions, or omissions may be made to the circuit 200 without departing from the scope of the present disclosure. For example, the differentiation between different circuits and components of the circuit 200 is merely to aid in the description and is not meant to be limiting. Additionally, the circuit 200 may include any number of components not expressly disclosed or discussed.

Figure 3:
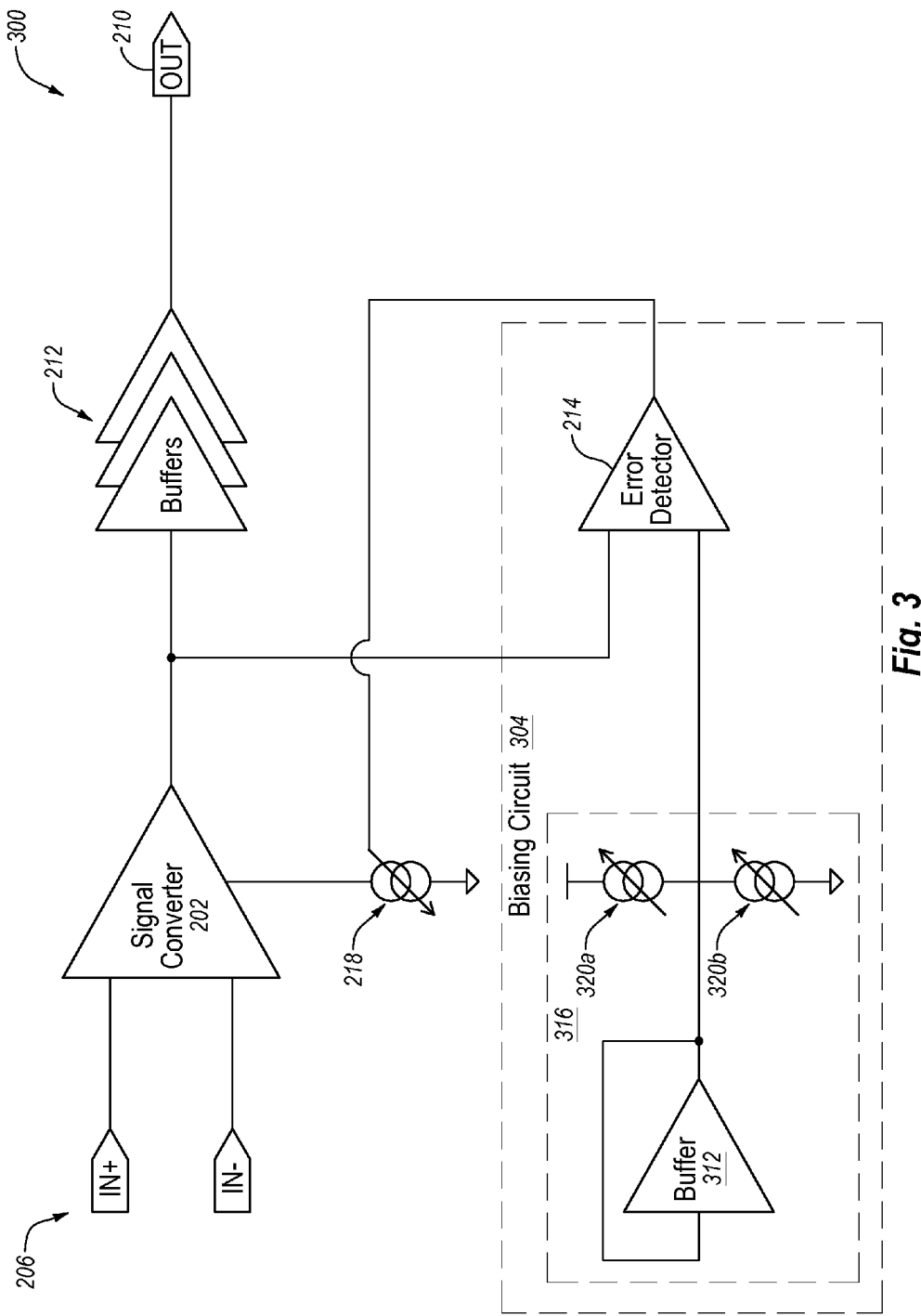
FIG. 3 illustrates another example differential to single-ended signal conversion circuit.

FIG. 3 illustrates an example differential signal to single-ended signal conversion circuit 300 ("the circuit 300"), arranged in accordance with at least one embodiment described herein. The circuit 300 may include the signal converter 202, the input terminal 206, the output terminal 210, the one or more buffers 212, and a biasing circuit 304. The signal converter 202, the input terminal 206, the output terminal 210, and the one or more buffers 212 may be configured as described above with respect to FIG. 2.

The biasing circuit 304 may include the error detector 214 configured as described above with respect to FIG. 2. Additionally, the biasing circuit 304 may include a reference generator 316 that may be an example implementation of the reference generator 216 of FIG. 2. The reference generator 316 may include a buffer 312 that is substantially the same as one or more of the buffers 212. In these or other embodiments, the buffer 312 may be identical to one or more of the buffers 212. By having the buffer 312 be substantially the same as or identical to one or more of the buffers 212, PVT variations in the buffer 312 may be substantially the same as the PVT variations in the buffers 212. Therefore, the PVT effects on the single-ended signal and on the reference voltage may be substantially the same such that problems associated with PVT variations may be reduced. Although the reference generator 316 is illustrated has having a single buffer 312, the reference generator 316 may include any number of buffers 312 that may also be substantially the same as or identical to the buffers 212.

In some embodiments, an input of the buffer 312 may be coupled to an output of the buffer 312. In this configuration, the buffer 312 may generate the reference voltage based on voltage leakage such that the reference voltage may be centered about the voltages that may be associated with the components of the buffer 312. Consequently, because the buffer 312 may be substantially similar, or identical, to the buffers 212, the reference voltage may be centered about the voltages associated with the buffers 212, which may be based on the same logic family (e.g., CMOS) as the load circuit. As such, the reference voltage may be at the average DC voltage needed for recognition of signals associated with the corresponding logic family.

In some embodiments, the reference generator 316 may also include a first adjustable current source 320a and a second adjustable current source 320b. In the illustrated configuration, the reference voltage may be based on the currents of the adjustable current sources 320. As such, the currents of the adjustable current sources 320 may be set or adjusted such that the reference voltage may be further adjusted to the target voltage level. For example, in some embodiments, the currents of the adjustable current sources 320 may be adjusted to compensate for absolute PVT variations that may be in the buffers 212 and 312 such that absolute PVT variations may also be at least partially compensated for in the generation of the reference voltage.

Modifications, additions, or omissions may be made to the circuit 300 without departing from the scope of the present disclosure. For example, the differentiation between different circuits and components of the circuit 300 is merely to aid in the description and is not meant to be limiting. Additionally, the circuit 300 may include any number of components not expressly disclosed or discussed.

Figure 4:
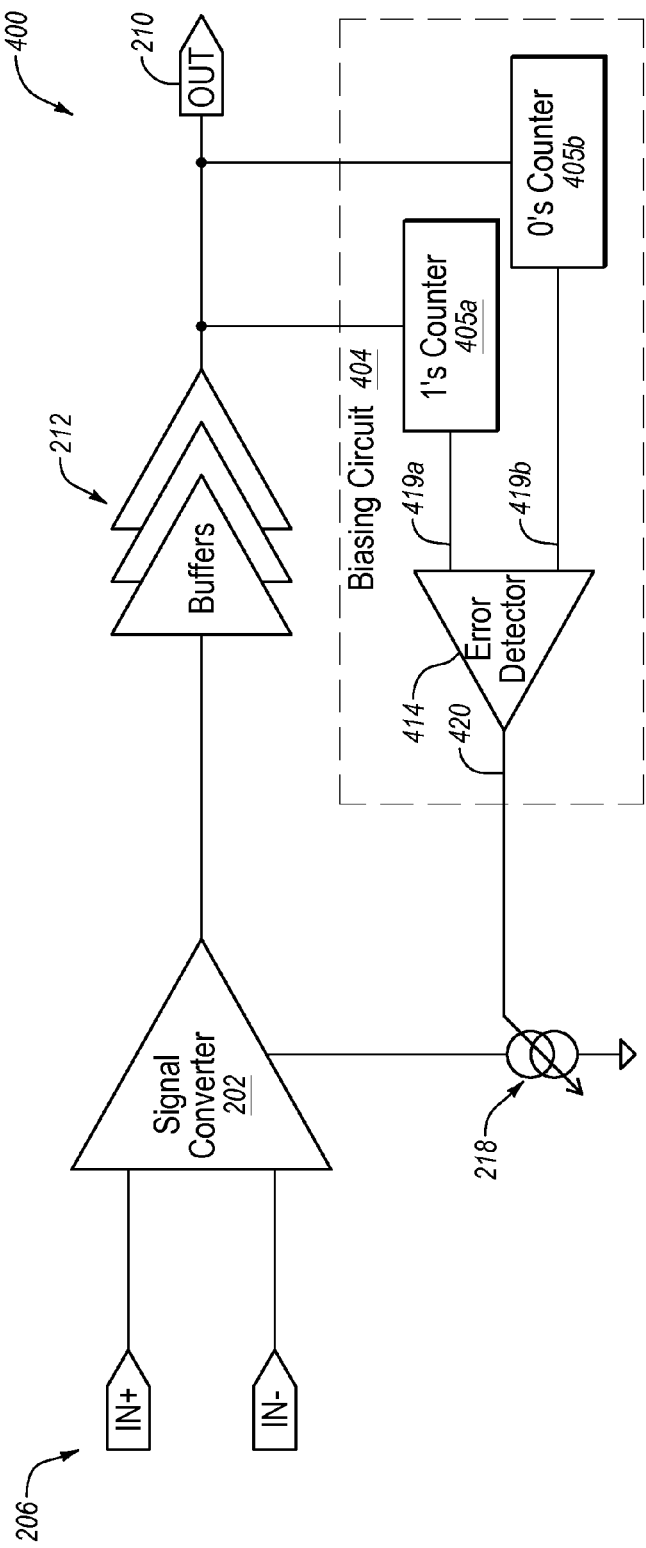
FIG. 4 illustrates another example differential to single-ended signal conversion circuit.

FIG. 4 illustrates an example differential signal to single-ended signal conversion circuit 400 ("the circuit 400"), arranged in accordance with at least one embodiment described herein. The circuit 400 may include the signal converter 202, the input terminal 206, the output terminal 210, the one or more buffers 212, and a biasing circuit 404. The signal converter 202, the input terminal 206, the output terminal 210, and the one or more buffers 212 may be configured as described above with respect to FIG. 2.

The biasing circuit 404 may include an error detector 414. Additionally, the biasing circuit 404 may include a first counter 405a and a second counter 405b. The counters 405 may be coupled to the output terminal 210 such that the counters 405 may each receive a feedback of the single-ended signal.

The first counter 405a may be configured to count the number of logical "ones" ("1's") that may be included in the single-ended signal over a certain time interval. As such the first counter 405a may also be referred to as a "1's counter." The second counter 405b may be configured to count the number of logical "zeroes" ("0's") that may be included in the single-ended signal over the same time interval. As such the second counter 405b may also be referred to as a "0's counter." In the present disclosure, the term "time interval" may refer to a duration of time (e.g., a number of microseconds) but does not limit the duration of time to a particular point in time. For example, reference to counting the number of logical ones and zeroes over a time interval of 10 microseconds may refer to counting the number of logical ones and zeroes over any 10 microsecond span of time and not just a particular 10 microsecond span of time.

Many signaling standards include a data balance rate that dictates that the number of logical ones and zeroes over a certain period of time be the same. Therefore, in some embodiments, the time interval may be based on the data balance rate of a signaling standard that may correspond to the single-ended signal. As such, the number of logical ones and zeroes in the single-ended signal over the time interval should be the same as dictated by the corresponding signaling standard. However, when the voltage level of the single-ended signal is not at a target voltage level, the number of logical ones and zeroes over the time interval may vary due to errors that may be caused by the voltage level not being at the target voltage level.

Accordingly, the counters 405a and 405b may be configured to begin counting and may count the respective logical ones and zeroes over the number of signal cycles that may correspond to the time interval. After the time interval has passed, the counters 405 may be configured to output their respective counts.

The first counter 405a may be coupled to a first input terminal 419a of the error detector 414 such that the error detector 414 may receive the count of logical ones at the first input terminal 419a. Additionally, the second counter 405b may be coupled to a second input terminal 419b of the error detector 414 such that the error detector 414 may receive the count of logical zeroes at the second input terminal 419b.

The error detector 414 may include any suitable system, apparatus, or device configured to compare the count that may be received at the first input terminal 419a with the count that may be received at the second input terminal 419b. The error detector 414 may be configured to generate the output signal based on whether the number of logical ones and zeroes over the time interval is substantially the same or the same.

For example, in some embodiments (such as the illustrated example of FIG. 4), the error detector 414 may include an error amplifier that is configured to generate an output signal at an output terminal 420 when counts from the first counter 405a and the second counter 405b are not equal. The adjustable current source 218 may be configured such that the output signal may drive the adjustable current source 218 in a manner that adjusts the bias and/or the gain of the signal converter 202 such that the voltage level of the single-ended signal may be set to the target voltage level. For example, in some embodiments, the error detector 414 may be configured such that the voltage of the output signal output by the error detector 414 is a function of the difference between the number of logical ones and logical zeroes. In particular, in some embodiments, the error detector 414 may be configured such that the voltage of the output signal may be equal to a multiplication of a gain factor (e.g., a constant greater than one) applied to the difference. The adjustment may be made such that or until the counts from the first counter 405a and the second counter 405b may be equal over the time interval because when the single-ended signal is at the target voltage level the number of logical ones and zeroes over the time interval are likely to be approximately equal or equal, as dictated by the corresponding standard.

By having the counters 405 receive the single-ended signal as feedback after the single-ended signal has passed through the buffers 212, e.g., as illustrated, effects of the PVT variations in the buffers 212 may be manifest in the single-ended signal that is received by the counters 405. Therefore, errors in the single-ended signal that may be caused by the PVT variations, and that may be manifest by unequal counts, may be at least partially compensated for by the error detector 414 when it generates the control signal that adjusts the adjustable current source 218.

Modifications, additions, or omissions may be made to the circuit 400 without departing from the scope of the present disclosure. For example, the differentiation between different circuits and components of the circuit 400 is merely to aid in the description and is not meant to be limiting. Additionally, the circuit 400 may include any number of components not expressly disclosed or discussed.

Figure 5:
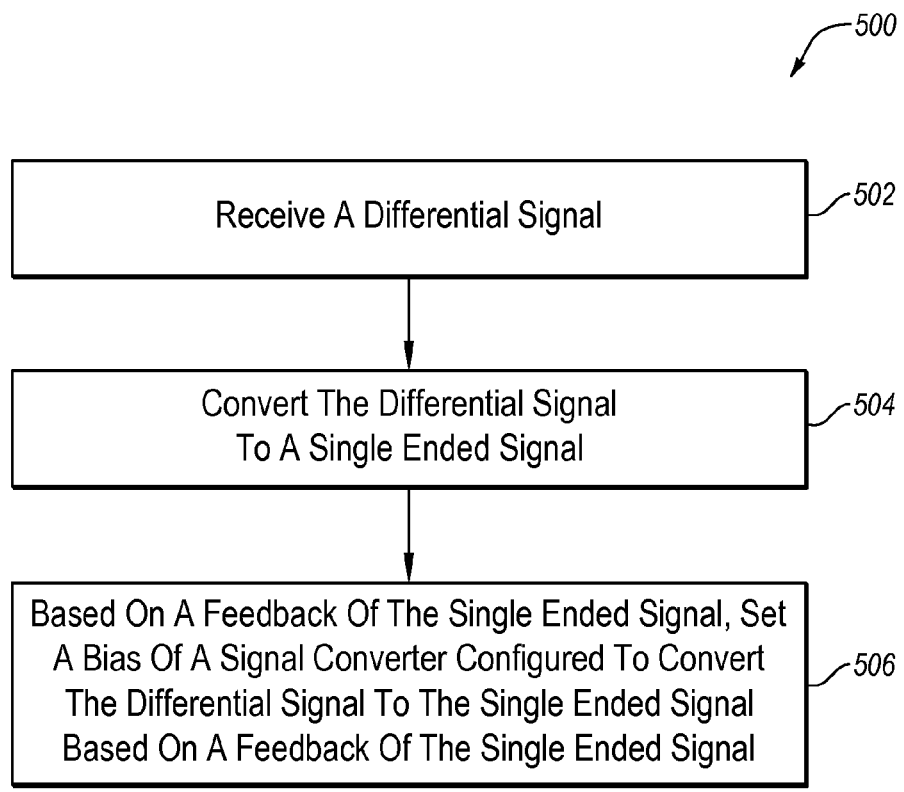
FIG. 5 is a flowchart of an example method of setting a voltage level of a single-ended signal converted from a differential signal.

FIG. 5 is a flowchart of an example method 500 of setting a voltage level of a single-ended signal converted from a differential signal, in accordance with at least one embodiment described herein. The method 500 may be implemented and performed, in some embodiments, by a differential signal to single-ended signal conversion circuit, such as the signal conversion circuits 100, 200, 300, and 400, described above. Although illustrated as discrete blocks, various blocks may be divided into additional blocks, combined into fewer blocks, or eliminated, depending on the desired implementation The method 500 may begin at block 502 where a differential signal may be received. The differential signal may have a first voltage level that may be based on any appropriate differential signaling scheme. For example, in some embodiments, the differential signal may be derived from a CML driver. In some embodiments, the conversion may be performed by a signal converter such as the signal converter 202 described above.

At block 504, the differential signal may be converted to a single-ended signal. At block 506 a bias of the signal converter may be set based on a feedback of the single-ended signal. The bias may be set such that the single-ended signal may have a second voltage level that is different from the first voltage level of the differential signal. In these and other embodiments, the bias may be set such that the second voltage level may be at a target voltage level that corresponds to any appropriate logic family of which a load circuit that may receive the single-ended circuit may be associated. For example, in some embodiments, the load circuit may be a CMOS logic family circuit and the bias may be set such that the second voltage level is at a CMOS voltage level.

Accordingly, the method 500 may be performed to set a voltage level of a single-ended signal that may be converted from a differential signal. One skilled in the art will appreciate that, for the method 500 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For example, FIGS. 6 and 7 below describe examples of setting the bias of a conversion circuit based on the feedback of a single-ended signal that has been converted from a differential signal.

Figure 6:
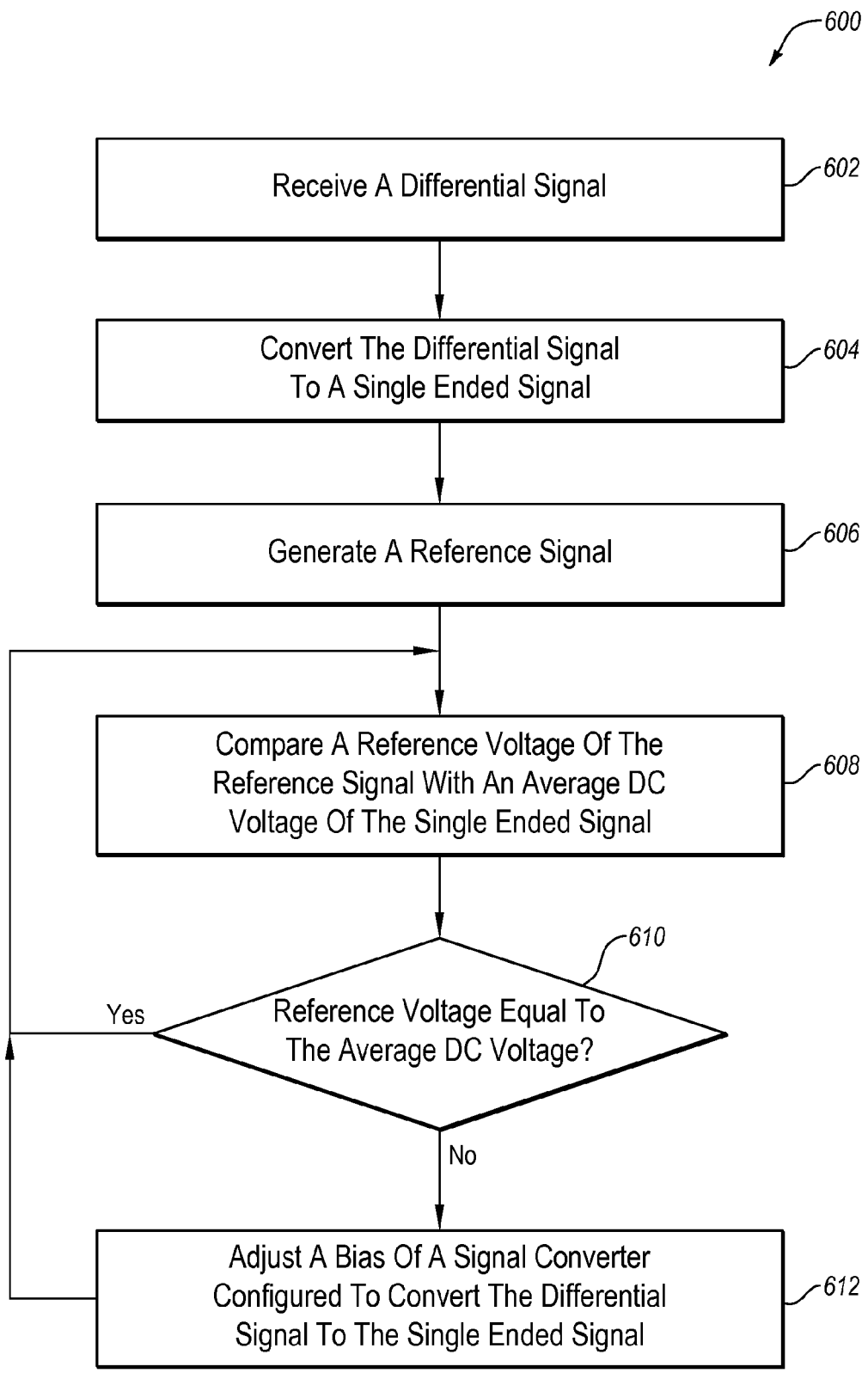
FIG. 6 is a flowchart of another example method of setting a voltage level of a single-ended signal converted from a differential signal.

FIG. 6 is a flowchart of an example method 600 of setting a voltage level of a single-ended signal converted from a differential signal, in accordance with at least one embodiment described herein. The method 600 may be implemented and performed, in some embodiments, by a differential signal to single-ended signal conversion circuit, such as the signal conversion circuits 100, 200, and 300, described above. Although illustrated as discrete blocks, various blocks may be divided into additional blocks, combined into fewer blocks, or eliminated, depending on the desired implementation The method 600 may begin at block 602 where a differential signal may be received. The differential signal may have a first voltage level that may be based on any appropriate differential signaling scheme. For example, in some embodiments, the differential signal may be derived from a CML driver. In some embodiments, the conversion may be performed by a signal converter such as the signal converter 202 described above.

At block 604, the differential signal may be converted to a single-ended signal. At block 606 a reference signal may be generated. The reference signal may include a reference voltage that may be based on a target voltage level of the single-ended signal. For example, the reference voltage may be based on a second voltage level that is different from the first voltage level of the differential signal. In these and other embodiments, the reference voltage may be at a target voltage level that corresponds to any appropriate logic family of which a load circuit that may receive the single-ended circuit may be associated. For example, in some embodiments, the load circuit may be a CMOS logic family circuit and the reference voltage may be at a CMOS voltage level.

In some embodiments, the reference signal may be generated by a reference buffer that is substantially the same as, or the same as, a load buffer that may be coupled between the signal converter and an output terminal configured to output the single-ended signal to a load circuit, such as described above with respect to FIG. 3. Further, in some embodiments, the reference voltage may be set or adjusted using an adjustable current source, such as described above with respect to FIG. 3.

At block 608, the reference voltage of the reference signal may be compared with an average DC voltage of the single-ended signal. At block 610, it may be determined whether the reference voltage is substantially equal to, or equal to, the average DC voltage of the single-ended signal.

When the reference voltage is substantially equal to, or equal to, the average DC voltage, the method 600 may return to block 608. When the reference voltage is not substantially equal to, or equal to, the average DC voltage, the method 600 may proceed to block 612.

At block 612 a bias of the signal converter may be adjusted based on the average DC voltage of the single-ended signal not being substantially equal to, or equal to, the reference voltage. Following block 612, the method 600 may return to block 608. The comparison and bias adjustment of blocks 608, 610, and 612, may be performed one or more times until the average DC voltage of the single-ended signal is substantially equal to, or equal to, the reference voltage. In some embodiments, the operations associated with blocks 608, 610, and 612 may be performed by an error detector such as the error detector 214 described above with respect to FIGS. 2 and 3.

Accordingly, the method 600 may be performed to set a voltage level of a single-ended signal that may be converted from a differential signal. One skilled in the art will appreciate that, for the method 600 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 7:
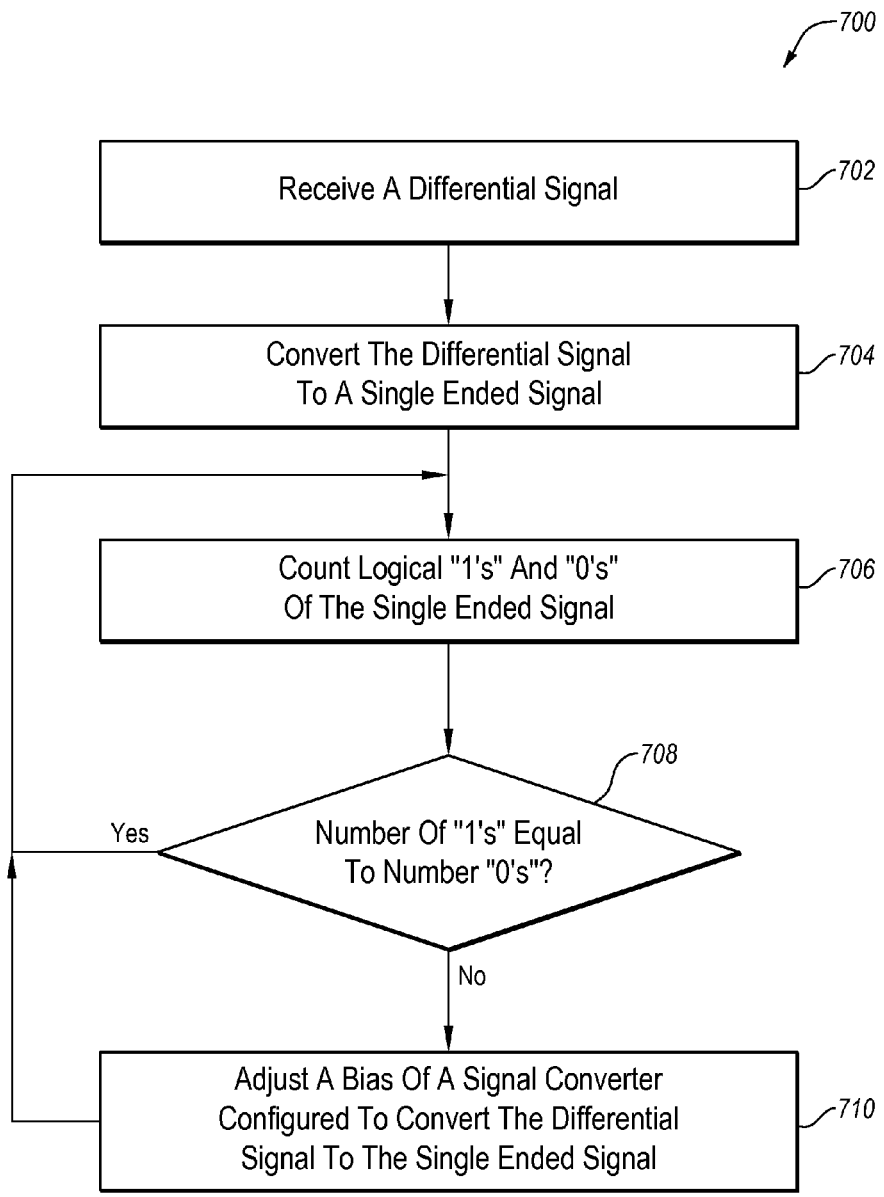
FIG. 7 is a flowchart of another example method of setting a voltage level of a single-ended signal converted from a differential signal.

FIG. 7 is a flowchart of an example method 700 of setting a voltage level of a single-ended signal converted from a differential signal, in accordance with at least one embodiment described herein. The method 700 may be implemented and performed, in some embodiments, by a differential signal to single-ended signal conversion circuit, such as the signal conversion circuits 100 and 400 described above. Although illustrated as discrete blocks, various blocks may be divided into additional blocks, combined into fewer blocks, or eliminated, depending on the desired implementation The method 700 may begin at block 702 where a differential signal may be received. The differential signal may have a first voltage level that may be based on any appropriate differential signaling scheme. For example, in some embodiments, the differential signal may be derived from a CML driver. In some embodiments, the conversion may be performed by a signal converter such as the signal converter 202 described above.

At block 704, the differential signal may be converted to a single-ended signal. At block 706 a number of logical ones ("1's") and zeroes ("0's") of the single-ended signal may be counted over a time interval. As described above, in some embodiments the time interval may be based on a data balance rate and the logical ones and zeroes may be counted over a number of signal cycles that may correspond to the time interval. In some embodiments, the operations associated with block 706 may be performed by a first counter configured to count the logical ones and by a second counter configured to count the logical zeroes such as the counters 405a and 405b, respectively, of FIG. 4.

At block 708, it may be determined whether the number of logical ones counted over the time interval is equal to the number of logical zeroes. When the number of logical ones is equal to the number of logical zeroes, the method 700 may return to block 706. When the number of logical ones is not equal to the number of logical zeroes, the method 700 may proceed to block 710.

At block 710 a bias of the signal converter may be adjusted based on the number of logical ones and logical zeroes counted over the time interval not being equal. Following block 710, the method 700 may return to block 706. The comparison and bias adjustment of blocks 708 and 710 may be performed one or more times until the number of logical ones and logical zeroes counted over the time interval is equal. For example, in some embodiments, the bias of the signal converter may be adjusted at block 710 and then, after the correction has had a chance to settle, the number of logical ones and zeroes may again be counted over the time interval at block 706. The new counts may be compared at block 708 to determine whether another correction is to be made at block 710 or whether no correction is to be made where the method 700 may return to block 706. In some embodiments, the operations associated with blocks 708 and 710 may be performed by an error detector such as the error detector 414 described above with respect to FIG. 4.

Accordingly, the method 700 may be performed to set a voltage level of a single-ended signal that may be converted from a differential signal. One skilled in the art will appreciate that, for the method 700 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 8:
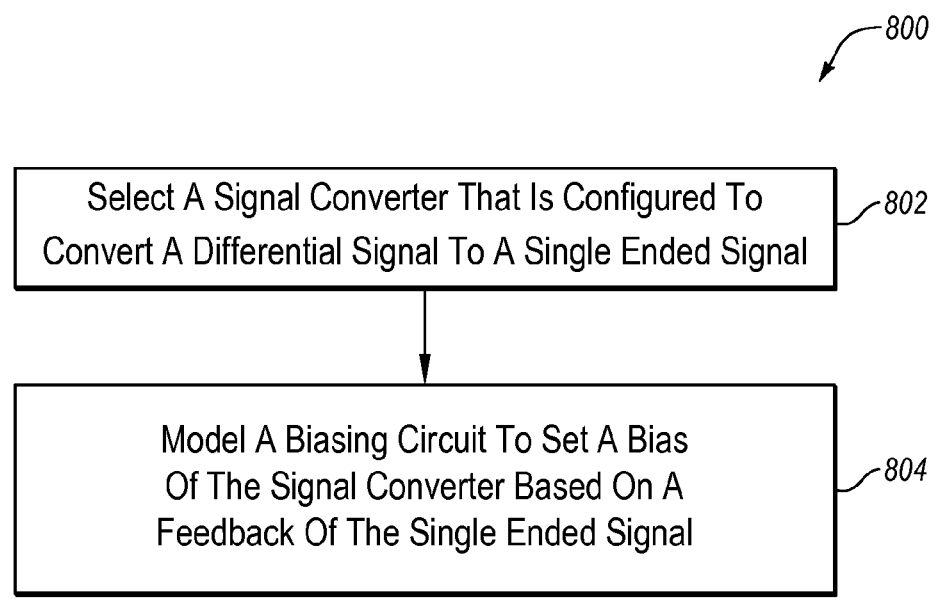
FIG. 8 is a flowchart of an example method of designing a differential to single-ended signal circuit.

FIG. 8 is a flowchart of an example method 800 of designing a differential signal to single-ended signal conversion circuit (referred to hereinafter as the "conversion circuit"), arranged in accordance with at least one embodiment described herein. The method 800 may be implemented, in some embodiments, using any applicable design software stored on a computer-readable storage medium. Further, the method 800 may be based on one or more of the principles described above with such that the designed conversion circuit may operate according to one or more of the circuits 100, 200, 300, and 400, of FIGS. 1-4, respectively. Although illustrated as discrete blocks, various blocks may be divided into additional blocks, combined into fewer blocks, or eliminated, depending on the desired implementation.

The method 800 may begin at block 802, where a signal converter may be selected. The signal converter may be selected based on a configuration in which the signal converter is configured to receive a differential signal, convert the differential signal to a single-ended signal and output the single-ended signal. For example, the selected signal converter may include any one of the signal converters 102 and 202 described above.

At block 804 a biasing circuit may be modeled as setting a bias of the signal converter based on a feedback of the single-ended signal that may be output by the signal converter. The biasing circuit may be modeled to set the bias of the signal converter such that a voltage level of the single-ended signal may be at a target voltage level. In some embodiments, the biasing circuit may be modeled according to one or more of the biasing circuits 104, 204, 304, and 404 of FIGS. 1, 2, 3, and 4, respectively.

One skilled in the art will appreciate that, for the method 800 and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For example, the method 800 may further include modeling the conversion circuit to include one or more buffers that may be configured similar to one or more of the buffers 212 described above with respect to FIGS. 2-4.

The method 800 described herein may be implemented using any suitable special-purpose or general-purpose computer, computing entity, or processing device including various computer hardware or software modules and may be configured to execute computer-executable instructions stored on any applicable computer-readable media. For example, the method 800 may be performed by a processor that may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data.

Computer-readable media may be any available media that may be accessed by a general-purpose or special-purpose computer (e.g., a processor). By way of example, and not limitation, such computer-readable media may include a non-transitory or tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or any other storage medium which may be used to carry or store program code in the form of computer-executable instructions or data structures and which may be accessed by a general-purpose or special-purpose computer. Combinations of the above may also be included within the scope of computer-readable media. The computer-readable media may include computer-executable instructions which may include, for example, instructions and data that cause a general-purpose computer, special-purpose computer, or special-purpose processing device to perform a certain function or group of functions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it is understood that the various changes, substitutions, and alterations could be made hereto without departing from the spirit and scope of the invention.

What is claimed is:

1. A circuit comprising:
    a signal converter configured to:
        receive a differential signal;
        convert the differential signal to a single-ended signal; and
        output the single-ended signal at an output of the signal converter; and
    a biasing circuit coupled to the output of the signal converter such that the biasing circuit is configured to receive a feedback of the single-ended signal, the biasing circuit including:
        a reference generator configured to generate a reference signal with a reference voltage based on a target voltage level of the single-ended signal that is different from a voltage level of the differential signal; and
        an error detector configured to:
            receive, at a first input terminal coupled to the output of the signal converter, the single-ended signal as a feedback of the single-ended signal;
            receive the reference signal at a second input terminal coupled to an output of the reference generator;
            compare the reference voltage with an average DC voltage of the feedback of the single-ended signal; and
            set a bias of the signal converter based on the comparison of the reference voltage and the average DC voltage such that a voltage level of the single-ended signal is at the target voltage level.

2. The circuit of claim 1, further comprising a buffer coupled to the output of the signal converter and wherein:
    the first input terminal of the error detector is coupled between the buffer and the output of the signal converter.

3. The circuit of claim 1, further comprising:
    an output terminal configured to output the single-ended signal; and
    a load buffer coupled between the output of the signal converter and the output terminal, wherein the reference generator includes a reference buffer that is substantially the same as the load buffer and that is configured to generate the reference signal.

4. The circuit of claim 3, wherein the reference buffer is the same as the load buffer.

5. The circuit of claim 1, wherein the reference generator further comprises an adjustable current source configured to generate a current of which the reference voltage is based.

6. The circuit of claim 1, wherein the signal converter comprises a converting amplifier.

7. A method comprising:
    receiving a differential signal;
    converting the differential signal to a single-ended signal;
    outputting the single-ended signal; and
    setting, based on a feedback of the outputted single-ended signal, a bias of a signal converter configured to convert the differential signal to the single-ended signal such that a voltage level of the single-ended signal is at a target voltage level that is different from a voltage level of the differential signal wherein setting the bias of the signal converter includes:
        generating a reference signal with a reference voltage based on the target voltage level of the single-ended signal, wherein the reference signal is generated using a reference buffer that is substantially the same as a load buffer coupled between the signal converter and an output terminal configured to output the single-ended signal to a load circuit;
        comparing the reference voltage with an average DC voltage of the feedback of the single-ended signal; and setting the bias of the signal converter based on the comparison of the reference voltage and the average DC voltage.

8. The method of claim 7, wherein the reference buffer is the same as the load buffer.

9. The method of claim 7, further comprising setting the reference voltage using an adjustable current source.

10. A circuit comprising:
a signal converter configured to:
receive a differential signal;
convert the differential signal to a single-ended signal; and
output the single-ended signal at an output of the signal converter; and
a biasing circuit coupled to the output of the signal converter such that the biasing circuit is configured to receive a feedback of the single-ended signal, the biasing circuit including:
a first counter configured to receive the feedback of the single ended signal and to count, as a first count, a first number of logical ones in the single-ended signal over a time interval;
a second counter configured to receive the feedback of the single ended signal and to count, as a second count, a second number of logical zeroes in the single-ended signal over the time interval; and
an error detector configured to:
receive the first count from the first counter;
receive the second count from second counter; and
set a bias of the signal converter based on the first count and the second count.

11. The circuit of claim 10, wherein the error detector is configured to set the bias of the signal converter such that the first count and the second count are equal over the time interval.

12. The circuit of claim 10, further comprising:
an output terminal configured to output the single-ended signal; and
a buffer coupled between the output of the signal converter and the output terminal, wherein the first counter is coupled between the output terminal and a first input terminal of the error detector and the second counter is coupled between the output terminal and a second input terminal of the error detector.

13. The circuit of claim 10, wherein the time interval is based on a target data balancing rate.

14. The circuit of claim 10, wherein the signal converter comprises a converting amplifier.

15. The circuit of claim 10, wherein the error detector is configured to set the bias such that a voltage level of the single-ended signal is at a target voltage level that is different from a voltage level of the differential signal.

* * * * *